United States Patent

Wang et al.

[11] Patent Number: 6,081,026
[45] Date of Patent: Jun. 27, 2000

[54] HIGH DENSITY SIGNAL INTERPOSER WITH POWER AND GROUND WRAP

[75] Inventors: Wen-chou Vincent Wang, Cupertino; Yasuhito Takahashi, San Jose; William T. Chou, Cupertino; Michael G. Peters, Santa Clara; Michael G. Lee, San Jose; Solomon Beilin, San Carlos, all of Calif.

[73] Assignee: Fujitsu Limited, Japan

[21] Appl. No.: 09/191,755

[22] Filed: Nov. 13, 1998

[51] Int. Cl.[7] .......................... H01L 23/12; H01L 23/053
[52] U.S. Cl. .......................... 257/700; 257/691; 257/781; 257/698; 257/738; 257/778; 257/780; 257/774; 361/794; 361/795
[58] Field of Search ..................................... 257/691, 700, 257/781, 698, 777, 774, 738, 737, 734, 735, 736, 778, 780, 779; 361/794, 795; 435/106, 108, 111, 125

[56] References Cited

U.S. PATENT DOCUMENTS

| | | | |
|---|---|---|---|
| 4,202,007 | 5/1980 | Dougherty et al. | 357/80 |
| 4,600,970 | 7/1986 | Bauer | 361/403 |
| 4,601,526 | 7/1986 | White et al. | 339/17 |
| 4,672,152 | 6/1987 | Shinohara et al. | 174/68.5 |
| 4,706,165 | 11/1987 | Takenaka et al. | 361/403 |
| 4,736,276 | 4/1988 | Ushifusa et al. | 361/414 |
| 4,821,142 | 4/1989 | Ushifusa et al. | 361/395 |

(List continued on next page.)

FOREIGN PATENT DOCUMENTS

| | | | |
|---|---|---|---|
| 0506225 A2 A3 | 9/1992 | European Pat. Off. | H01L 23/538 |
| 406053349 | 2/1994 | Japan . | |
| 406085100 | 3/1994 | Japan . | |

OTHER PUBLICATIONS

Craig N. Ernsberger et al. FLEXCON ™ '96, "Colaminated Multilayer Flip Chip T–BGA Package Development" 29–43.

Sarah E. Lech et al. 1997 International Symposium on Advanced Packaging Materials, "Colamination Technology for electronic Packaging Applications" 38–41.

Catherine Gallagher et al. 1997 International Symposium on Advanced Packaging Materials, "Vertical Interconnect in Multilayer Applications Using Ormet® Conductive Composites" 35–37.

(List continued on next page.)

*Primary Examiner*—Tom Thomas
*Assistant Examiner*—Luan Thai
*Attorney, Agent, or Firm*—Coudert Brothers

[57] ABSTRACT

An interposer for providing power, ground, and signal connections between an integrated circuit chip or chips and a substrate. The interposer includes a signal core and external power/ground connection wrap. The two sections may be fabricated and tested separately, then joined together using z-connection technology. The signal core is a dielectric film with patterned metal on both sides. The two metal layers are interconnected by a through via or post process. The power/ground wrap includes an upper substrate positioned above the signal core and a lower substrate positioned below the signal core. The upper and lower substrates of the power/ground wrap are formed from a dielectric film having a patterned metal layer on both sides connected by a through via or post process. The upper power/ground wrap substrate, signal core, and lower power/ground substrate are interconnected as desired using z-connection technology (e.g., solder or conductive ink). The power/ground layers on the upper substrate can be connected to the power/ground layers on the lower substrate by suitable edge connectors. With an integrated circuit chip or chips connected to the upper layer of the top substrate of the power/ground wrap and a printed circuit board or other mounting substrate connected to the bottom layer of the lower substrate of the wrap, the inventive interposer provides a set of high density and electrically isolated signal, power, and ground interconnections.

6 Claims, 6 Drawing Sheets

U.S. PATENT DOCUMENTS

| | | | |
|---|---|---|---|
| 4,922,377 | 5/1990 | Matsumoto et al. | 361/387 |
| 4,926,241 | 5/1990 | Carey | 357/75 |
| 4,931,134 | 6/1990 | Hatvervitz | 156/630 |
| 4,984,132 | 1/1991 | Sakurai et al. | 361/414 |
| 5,012,047 | 4/1991 | Dohya | 174/250 |
| 5,036,431 | 7/1991 | Adachi et al. | 361/412 |
| 5,142,448 | 8/1992 | Kober et al. | 361/398 |
| 5,159,530 | 10/1992 | Komoto | 361/386 |
| 5,264,729 | 11/1993 | Rostoker et al. | 257/774 |
| 5,281,151 | 1/1994 | Arima et al. | 439/68 |
| 5,325,268 | 6/1994 | Nachnani et al. | 361/767 |
| 5,331,514 | 7/1994 | Kuroda | 361/760 |
| 5,354,955 | 10/1994 | Gregor et al. | 174/250 |
| 5,362,656 | 11/1994 | McMahon | 437/21 |
| 5,367,435 | 11/1994 | Andros et al. | 361/749 |
| 5,375,042 | 12/1994 | Arima et al. | 361/784 |
| 5,382,757 | 1/1995 | Ishida | 174/262 |
| 5,396,034 | 3/1995 | Fujita et al. | 174/261 |
| 5,419,038 | 5/1995 | Wang et al. | 29/830 |
| 5,435,733 | 7/1995 | Chernicky et al. | 439/68 |
| 5,450,290 | 9/1995 | Boyko et al. | 361/792 |
| 5,477,933 | 12/1995 | Nguyen | 174/262 |
| 5,479,110 | 12/1995 | Crane et al. | 324/757 |
| 5,534,666 | 7/1996 | Ishida | 174/260 |
| 5,544,017 | 8/1996 | Beilin et al. | 361/790 |
| 5,854,534 | 12/1998 | Beilin et al. | 257/691 |

OTHER PUBLICATIONS

Ernsberger Proceedings of the First International Conference on Flex Circuits, Oct. 10–14, 1994, High Density Multilayer Interconnect Based on Adhesiveless Flex Circuits.

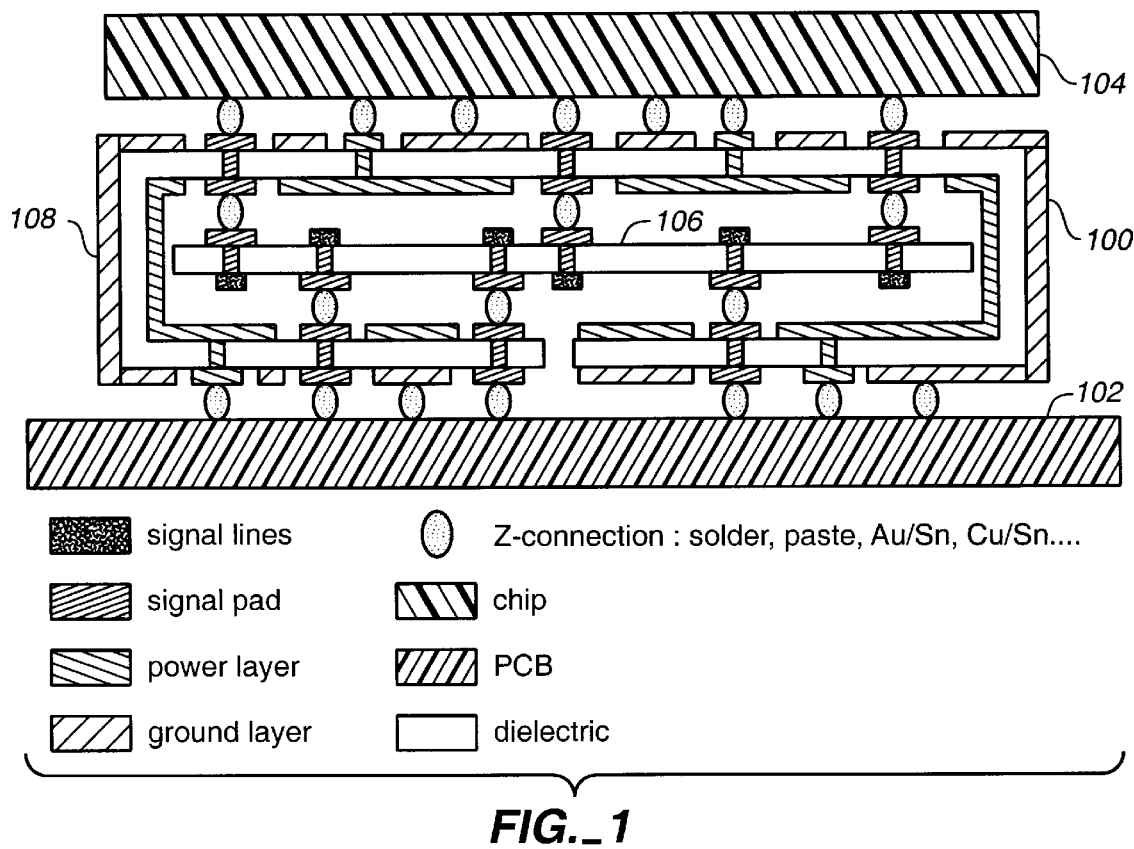
FIG._1
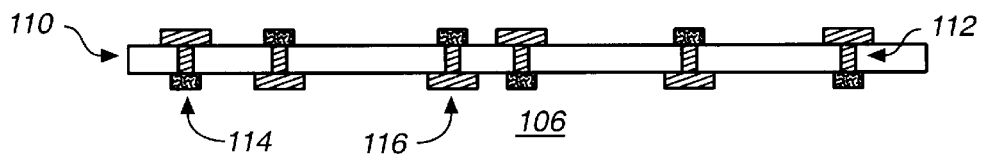
FIG._2
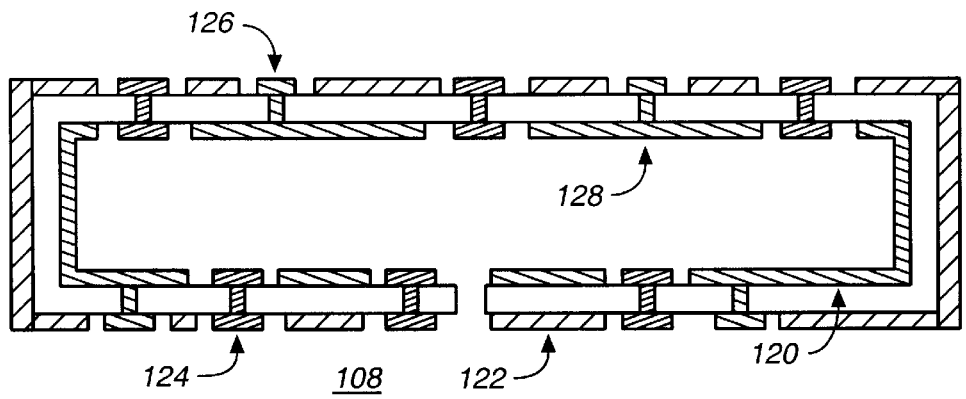
FIG._3

FIG._4a.
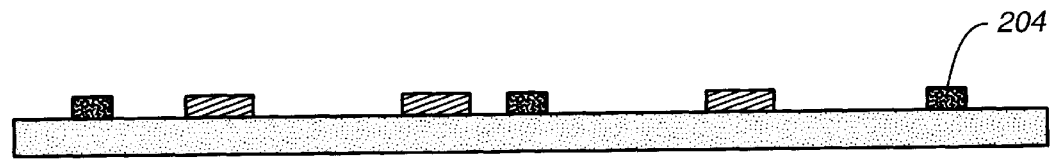
FIG._4b.
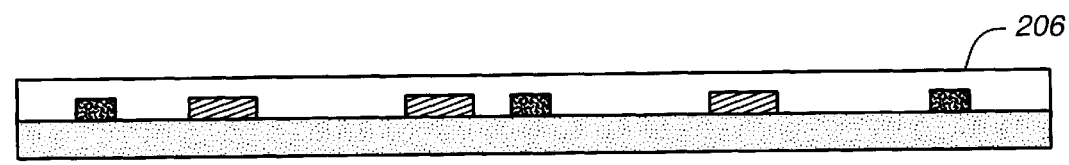
FIG._4c.
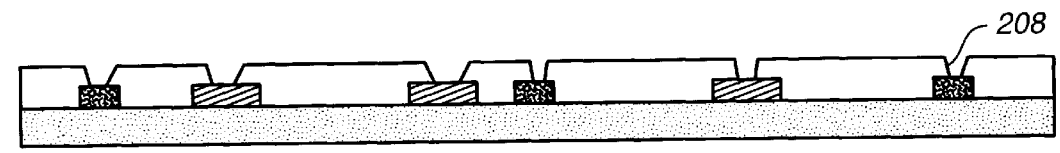
FIG._4d.
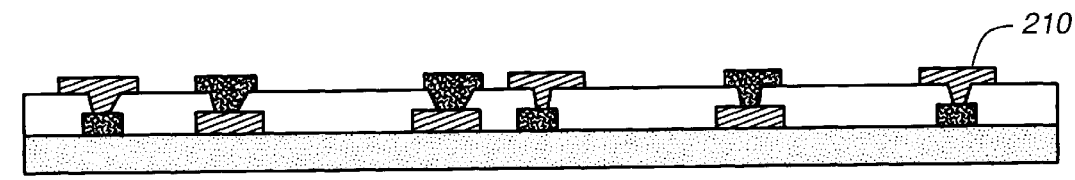
FIG._4e.
FIG._4f.

FIG._5a.
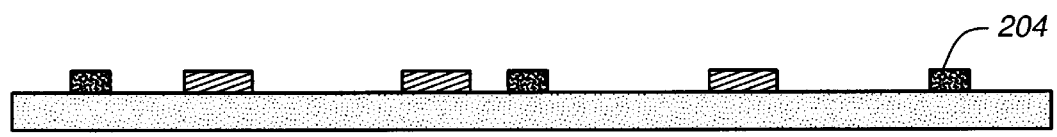
FIG._5b.
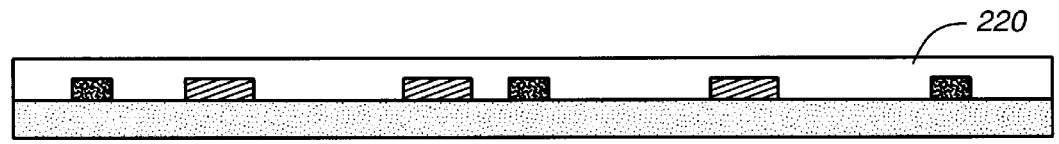
FIG._5c.
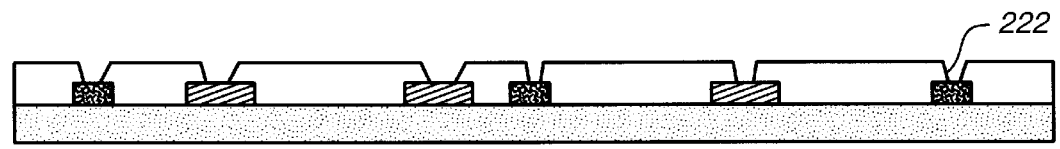
FIG._5d.
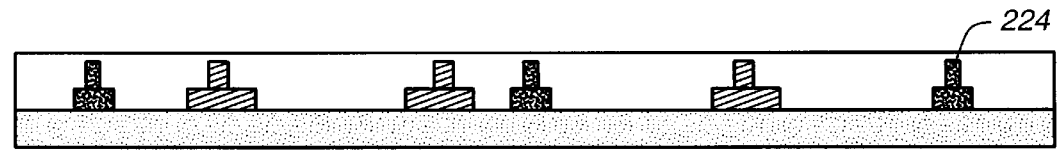
FIG._5e.
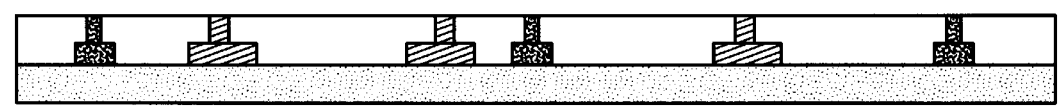
FIG._5f.
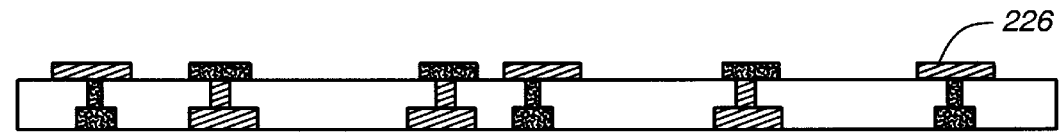
FIG._5g.

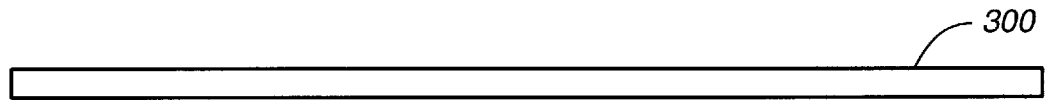
FIG._6a.
FIG._6b.
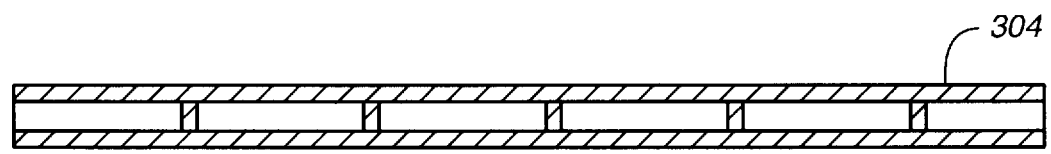
FIG._6c.
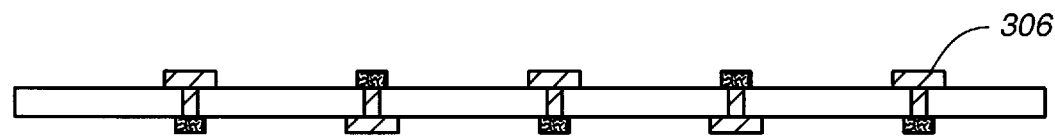
FIG._6d.

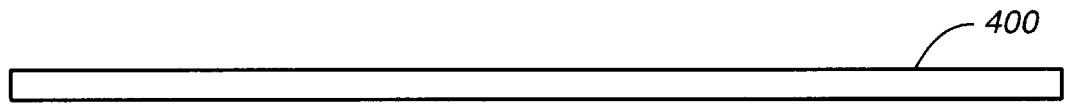
FIG._7a.
FIG._7b.
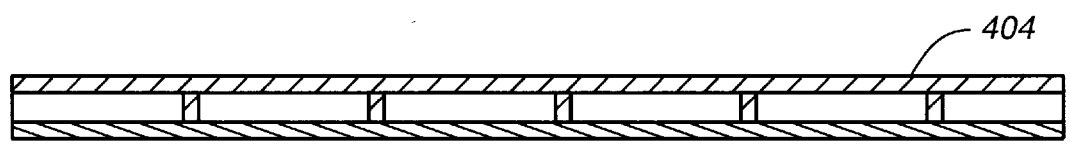
FIG._7c.
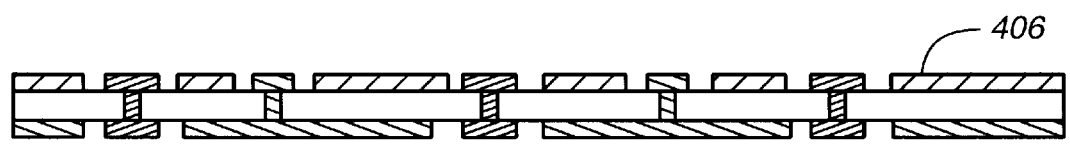
FIG._7d.
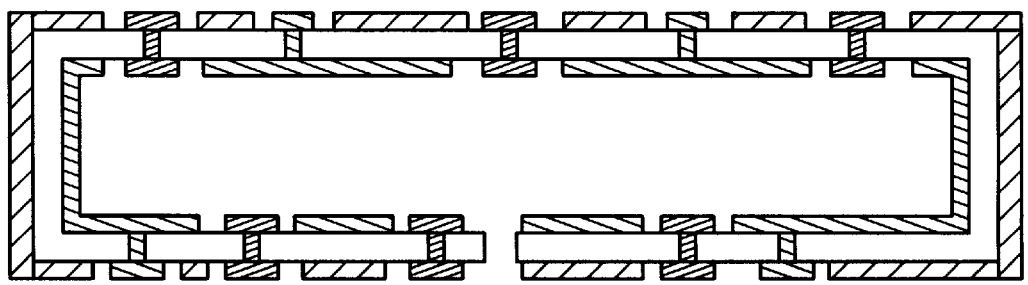
FIG._7e. 108

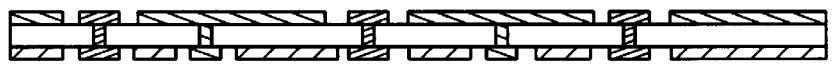
FIG._8a.
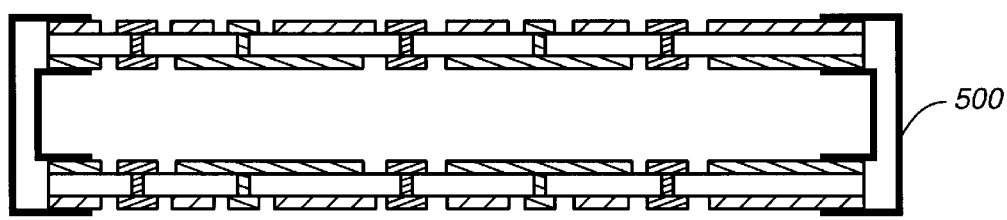
FIG._8b.
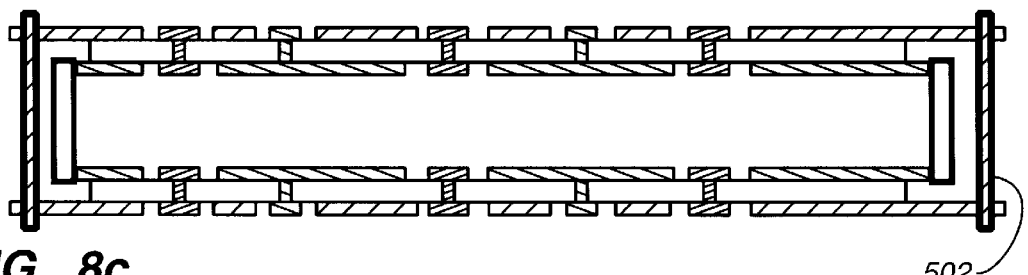
FIG._8c.
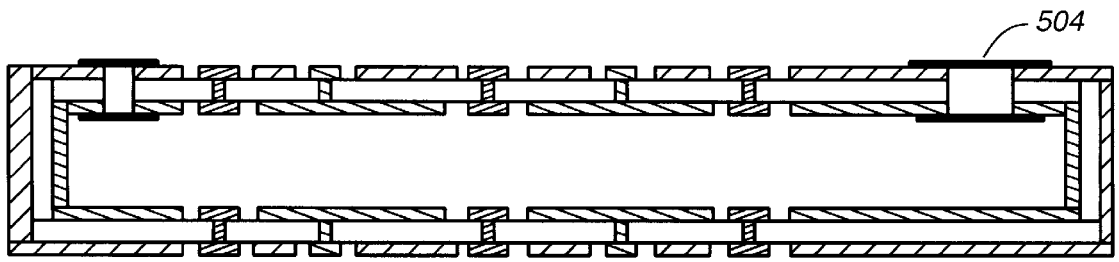
FIG._8d.

HIGH DENSITY SIGNAL INTERPOSER WITH POWER AND GROUND WRAP

BACKGROUND OF THE INVENTION

1. Field of the Invention

The present invention relates to integrated circuit device packaging, and more specifically, to an interposer substrate for interconnecting integrated circuit chips to a printed circuit board or other substrate.

2. Description of the Prior Art

An interposer is a structure used in the manufacture of single and multi-chip modules (SCMs or MCMs) to electrically connect one or more integrated circuit chips (ICs) to a printed circuit board or other substrate. The interposer provides power and ground connections between the board or substrate and the ICs. The interposer also provides signal paths between the IC chips and the board or substrate, and if desired, between different chips mounted on the interposer. An interposer thus provides a means of interconnecting signal, power, and ground lines between a substrate, an integrated circuit chip or chips, and ultimately a package containing the chip(s).

As the number of components in electronic devices increases and the size of the individual components decreases, there is an increase in the number and density of power, ground, and signal interconnections needed between individual ICs and the substrate on to which the chips are connected. This means that the density of the interconnections which need to be included as part of an interposer also increases. However, problems arise in placing signal lines in close proximity to each other and to power supply lines when fabricating an interposer. These problems include interference and cross-talk arising from coupling between the lines, capacitive coupling between the lines and the substrate which produces noise in the signals. The dielectric constant of the substrate material thus plays an important role in reducing (or creating) these type of problems.

Another disadvantage of conventional approaches to packaging IC chips in MCMs arises from the method used to deliver power to the chips. This problem results because power lines are routed through the same substrate utilized to carry signals to and from the chip. The power feedthroughs will compete for space with the signal I/O lines. This will further increase the problems caused by dense signal traces. Another important disadvantage is that the thinness of the substrates used in traditional multichip modules results in the power feeds to the IC chips having relatively high impedance. This results in undesired noise, power loss, and excess thermal energy production. These problems are relevant to the routing of both power and signal lines though an interposer substrate.

What is desired is an interposer for interconnecting a single integrated circuit chip to a substrate, or for interconnecting a plurality of chips to each other and to a substrate, which addresses the noted disadvantages of conventional structures.

SUMMARY OF THE INVENTION

The present invention is directed to an interposer for providing power, ground, and signal connections between an integrated circuit chip or chips and a substrate. The inventive interposer includes a signal core and external power/ground connection wrap. The two sections may be fabricated and tested separately, then joined together using z-connection technology. The signal core is a dielectric film with patterned metal on both sides. The two metal layers are interconnected by a through via or post process. The power/ground wrap includes an upper substrate positioned above the signal core and a lower substrate positioned below the signal core. The upper and lower substrates of the power/ground wrap are formed from a dielectric film having a patterned metal layer on both sides connected by a through via or post process. The two power/ground wrap substrates are maintained in their proper alignment relative to the signal core and to each other by edge connectors.

The top layer of the upper power/ground wrap substrate and the bottom layer of the lower power/ground wrap substrate serve as the ground layer. The ground layer includes isolated pads for signal and power interconnections between the base substrate on which the interposer is mounted and the chip(s) mounted on top of the interposer. The bottom layer of the upper substrate and the top layer of the lower substrate of the power/ground wrap serve as the power layer and include isolated pads for signal interconnections. With an integrated circuit chip or chips connected to the upper layer of the top substrate of the power/ground wrap and a printed circuit board or other mounting substrate connected to the bottom layer of the lower substrate of the wrap, the inventive interposer provides a set of high density and electrically isolated signal, power, and ground interconnections.

BRIEF DESCRIPTION OF THE DRAWINGS

FIG. 1 is a schematic cross-sectional view of the signal interposer of the present invention, and is shown positioned between a printed circuit board and an integrated circuit chip.

FIG. 2 is a schematic cross-sectional view of the signal core which is part of the interposer of the present invention.

FIG. 3 is a schematic cross-sectional view of the power/ground wrap which is part of the interposer of the present invention.

FIGS. 4(a) to (f) show a process flow for a first method of fabricating the signal core which is part of the interposer of the present invention.

FIGS. 5(a) to (g) show a process flow for a second method of fabricating the signal core which is part of the interposer of the present invention.

FIGS. 6(a) to (d) show a process flow for a third method of fabricating the signal core which is part of the interposer of the present invention.

FIGS. 7(a) to (e) show a process flow for a first method of fabricating the power/ground wrap which is part of the interposer of the present invention.

FIGS. 8(a) to (d) show a process flow for a second method of fabricating the power/ground wrap which is part of the interposer of the present invention.

DETAILED DESCRIPTION OF THE INVENTION

The present invention is directed to an interposer designed to provide signal, power, and ground connections between an integrated circuit chip and an underlying printed circuit board or substrate. The inventive interposer provides several advantages over conventional structures:

(1) The density of the interposer signal routing lines can be higher than for conventional interposers because there are no power and ground line connects which pass through the signal core. In this regard, the gap between vias which connect signal lines is increased by approximately a factor of the square root of 2 compared to the line density on a chip. This means that the signal line density on the interposer can be increased relative to that on a chip which includes power and ground lines;

(2) Different technology and processes can be used to fabricate the signal core and the power/ground wrap. Since the pattern size of the power/ground wrap is larger, a lower cost process (e.g., subtractive) can be used;

(3) The signal core and power/ground wrap can be fabricated and tested separately. This is advantageous because the cycle time and yield of parallel processes will be better than for sequential processes;

(4) The majority of the power/ground vias can be replaced by an edge connection. If a laser is used to drill the vias, the need for fewer vias will reduce the cost of this aspect of the fabrication; and (5) If a decoupling capacitor or termination resistor is needed, it (they) can be connected externally through the edge connector of the power/ground layers in one direction and the edges of the signal layers in another direction. This will provide a three-dimensional package.

As the inventors have realized, not all of the connections (power, ground, signal, resistor, capacitor, etc.) need to pass through the printed circuit board or substrate. The signal traces can be increased in density and the cost of the printed circuit board can be reduced by using the inventive structure.

FIG. 1 is a schematic cross-sectional view of the signal interposer 100 of the present invention, and is shown positioned between a printed circuit board 102 and an integrated circuit chip 104. The legend for the figure identifies the various components of the complete structure. As shown in the figure, interposer 100 includes two primary sections; a signal core 106 and a power/ground wrap 108. The two sections can be fabricated and tested separately and then joined together using a z-connection technology, e.g., solder bumps, anisotropic conducting polymers, or another suitable method.

As shown in the figure, in accordance with the present invention, power and ground interconnections are routed between the mounting substrate 102 and the chip(s) 104 without passing through the signal core 106. On the other hand, the signal lines are routed between the mounting substrate 102 and the chip(s) 104 by passing only through the signal core. This architecture provides electrical isolation between the power, ground, and signal interconnections (and hence noise and other problems caused by capacitive coupling between lines) while increasing the density of signal lines which can be connected between the substrate and chip(s).

FIG. 2 is a schematic cross-sectional view of signal core 106 which is part of the interposer of the present invention. Signal core 106 is formed from a dielectric film 110 (e.g., Polyimide, BT, etc.) on both sides of which is patterned a metal layer. The two metal layers are interconnected as desired by either a through via or a conductive post structure 112. Signal core 106 can be a free standing film or it can be fabricated from a film on top of a supporting ring formed by etching the center part of the dielectric substrate.

Dielectric layer 110 is typically 25 to 50 microns thick. The patterned metal layers include signal lines 114 and signal pads 116. Signal lines 114 are typically 20 microns wide with a pitch of 20 microns. The size/pitch can be reduced further if desired, e.g., to a width of 5 microns and pitch of 7.5 microns. Signal pads 116 are used to interconnect signals between layers of the overall mounting substrate-interposer-chip structure. Signal pads 116 are typically 100 microns wide with a pitch of 350 microns.

FIG. 3 is a schematic cross-sectional view of power/ground wrap 108 which is part of the interposer of the present invention. Power/ground wrap 108 is formed from a dielectric film 120 (e.g., Polyimide, BT, etc.) on both sides of which is patterned a metal layer. The two metal layers are interconnected as desired by either a through via or conductive post. Substrate 120 is formed into the shape shown in the figure, i.e., a box-shaped structure having a space between an upper and lower substrate. A ground layer 122 is formed from the metal layer arranged on the top/outer surface of dielectric substrate 120. Ground layer 122 includes electrically isolated pads for signal 124 and power 126 interconnections between signal core 106, power/ground wrap 108, chip 104, and substrate 102. A power layer 128 is formed from the metal layer arranged on the bottom/inner surface of dielectric substrate 120. Power layer 128 includes electrically isolated pads for signal interconnections between signal core 106, power/ground wrap 108, chip 104, and substrate 102.

Dielectric layer 120 is typically 25 to 50 microns thick. Ground layer 122 provides a continuous ground plane formed from a 5 to 20 micron thick layer of copper, for example. Ground layer 122 includes isolation rings to permit power and signal lines to be fed through the layer. The signal 124 and power 126 pads formed on ground layer 122 are typically 100 microns wide with a pitch of 250 microns. Note that the size or pitch may be increased if desired since a ground connection via is not needed.

Power layer 128 provides a continuous plane formed from a 5 to 20 micron thick layer of copper, for example and includes isolation rings to permit signal lines to be fed through the layer. The signal pads formed on power layer 128 are typically 100 microns wide with a pitch of 350 microns. With the signal core of FIG. 2 inserted between the upper and lower substrates of the power/ground wrap, signal connections may be made between the base substrate (element 102 of FIG. 1), the signal core, and the integrated circuit chip(s) in isolation from the power and ground connections between the base substrate and the chip(s). This permits an increase in signal line density and minimization of signal path lengths while achieving a high degree of electrical isolation between the different types of lines. Note that in the design for power/ground wrap 108 shown in the figure, the ground connections are arranged on the outside surfaces of the wrap, while the power connections are on the inside surfaces. This acts to isolate the power and ground connections from each other, as well as from the signal connections which pass through the signal core.

FIGS. 4(a) to (f) show a process flow for a first method of fabricating the signal core which is part of the interposer of the present invention. In the process flow shown in FIG. 4, the metal layers on the two sides of the dielectric substrate are interconnected by a through via. As shown in the figures, the process flow begins with a sacrificial substrate 202 (FIG. 4(a)). A metal layer 204 is then formed over the substrate and patterned as desired (FIG. 4(b)). A dielectric layer 206 (which will become the substrate for the finished signal core) is then formed over the patterned metal layer (FIG. 4(c)). The locations for the through vias are then defined on the top dielectric layer 206, and the vias 208 are formed by a suitable process, e.g., etching or drilling through the dielectric layer (FIG. 4(d)). A plating or metallization step is then used to fill the vias with a conductive material 210 (FIG. 4(e)). The initial substrate (as shown in FIG. 4(a)) is then removed, typically by using an etch process, leaving the signal core 106 (FIG. 4(*f*)). The signal core may also be peeled off of the substrate.

Note that an additive process is preferable for steps "b" and "e" to achieve metal patterning of 5–10 microns width and a pitch of 5–10 microns. If the line width or pitch can be larger, a subtractive process may be used. In the step of FIG. 4(*d*), the vias can be formed by either laser drilling or plasma etch. As noted, in the step of FIG. 4(*f*), the signal core is removed from the sacrificial substrate.

FIGS. 5(*a*) to (*g*) show a process flow for a second method of fabricating the signal core which is part of the interposer of the present invention. In the process flow shown in FIG. 5, the metal layers on the two sides of the dielectric substrate are interconnected by a conductive post. As shown in the figures, the process flow begins with a substrate 202 (FIG. 5(*a*)). A metal layer 204 is then formed over the substrate and patterned (FIG. 5(*b*)). A resist layer 220 is then formed over the patterned metal layer (FIG. 5(*c*)). The top resist layer is then patterned to form the locations 222 for the posts (FIG. 5(*d*)). The conductive posts 224 are then formed by a suitable electrolytic deposition process. A dielectric layer is then formed over the posts (FIG. 5(*e*)). A chemical-mechanical polishing process is then used to planarize the top dielectric layer and level the posts (FIG. 5(*f*)). Finally, a metallization step is used to form conductive contacts 226 on the tops of the posts (FIG. 5(*g*)).

Note that an additive process is preferable for steps "b" and "g" to achieve metal patterning of 5–10 micron line widths and 5–10 micron pitch. If the line width or pitch can be larger, a subtractive process may be used. In the step shown in FIG. 5(*f*), the chemical mechanical polishing is used to expose the post. In the step shown in FIG. 5(*g*), the signal core 106 is removed from the sacrificial substrate shown in FIG. 5(*a*).

FIGS. 6(*a*) to (*d*) show a process flow for a third method of fabricating the signal core 106 which is part of the interposer of the present invention. The process flow shown in FIG. 6 is, like that of FIG. 4, one in which the metal layers on the two sides of the dielectric substrate are interconnected by a through via. The process begins with a dielectric substrate 300 (FIG. 6(*a*)). Holes 302 for the vias are formed in the desired locations by laser drilling or a plasma etch (FIG. 6(*b*). The vias are filled with a conductive material and a metal layer 304 is formed on the top and bottom of the substrate by electroless plating or direct plating, followed by electrolytic plating(FIG. 6(*c*)). The metal layers are then patterned to form pads 306 on the metal layers which are interconnected by the through vias (FIG. 6(*d*)). Note that it is preferable to use an additive process for step "d" to achieve metal patterning of 5–10 micron line widths and 5–10 micron pitch. If the line width or pitch can be larger, then a subtractive process may be used.

FIGS. 7(*a*) to (*e*) show a process flow for a first method of fabricating the power/ground wrap 108 which is part of the interposer of the present invention. The fabrication process shown begins with a dielectric substrate 400 (FIG. 7(*a*)). Through vias 402 are formed in the substrate at the desired locations (FIG. 7(*b*)). The vias may be formed by a laser drill, plasma etching, or another suitable method. The vias are then filled with a conductive material, and a conductive layer 404 is formed on the upper and lower surfaces of the substrate (FIG. 7(*c*)). The conductive material may be applied by an electroless and/or electrolytic plating process. Metal chemical vapor deposition (MCVD) or another suitable process may also be used. The conductive layers on the upper and lower surfaces of the substrate are then patterned to form the desired power, ground, and signal connections 406 (FIG. 7(*d*)). A subtractive process may be used to form the patterned layers. Since substrate 400 is a thin-film, it may be bent to form the structure of FIG. 7(*e*) from that of FIG. 7(*d*).

FIGS. 8(*a*) to (*d*) show a process flow for a second method of fabricating the power/ground wrap 108 which is part of the interposer of the present invention. In this method, the need for precise alignment between the top, bottom, and sides of the wrap and the signal core (which is present in the method described with reference to FIG. 7) is lessened. Instead, in this process, the top and bottom pieces of the ground/power layers are fabricated as separate substrates and assembled to the signal core separately. As shown in FIG. 8(*a*), the upper and lower surfaces of the power/ground wrap are formed as separate substrates using the process described with reference to FIGS. 7(*a*) to 7(*d*). Edge connectors 500, 502 are used to interconnect the power/ground planes between the two substrates as needed (FIGS. 8(*b*), 8(*c*)). If a flexible substrate is used, the lower power/ground layer can be bent and plane solid connectors 504 used to connect to the upper power/ground layer (FIG. 8(*d*)).

When fabricating the inventive signal interposer structure using the process flow of FIG. 8, the upper power/ground substrate or surface, signal core, and lower power/ground substrate or surface are interconnected as required using a suitable z-connection technology, followed by attachment of the edge connectors to interconnect the power/ground substrates.

A preferred z-connection technology suited for use in constructing the present invention is described in U.S. patent application Ser. No. 09/132,203, entitled "Multilayer Laminated Substrates With High Density Interconnects and Methods of Making the Same," (Attorney Docket No. 6136/53588) listing Hung Hang Jiang, Tom Massingill, Mark Thomas McCormack, and Michael Guang-Tzong Lee as inventors, assigned to the assignee of the present invention, and the contents of which is incorporated by reference.

The integrated circuit chip(s) can be attached to the inventive interposer by flip chip, TAB (tape automated bonding), flip TAB, wire bonding, or another suitable method. For most applications, the preferred interconnection method is a flip chip area array process. The interposer can be connected to the PCB or other substrate by means of a ball grid array (BGA).

The inventive interposer structure provides several important advantages compared to conventional interposers. Firstly, since there are no power and ground line interconnects passing through the signal core, the signal routing density can be higher than for conventional interposers. This occurs because the separation between vias in which signal lines can be formed in the inventive structure is increased by a factor of approximately the square root of 2 relative to the separation between signal, power, or ground lines on a chip. For example, the separation between signal vias on the interposer becomes approximately 350 microns for applications with a 250 micron via pitch on the chip. This means that the signal line routing density can be increased on the interposer relative to its value for the chip, without introducing significant cross-talk, etc. (i.e., a signal line pitch of 250 microns on the interposer corresponds to a smaller, impractical pitch on the chip if all of the signal, power, and ground lines were fabricated on the chip).

This benefit of the present invention can be understood by reference to the following diagrams.

With S: signal, V: power, and G: ground, the lines on the chip can be represented as:

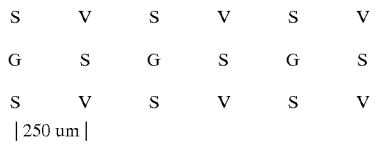

The separation between lines (pitch) is shown as 250 microns, a typical value.

However, with the inventive interposer structure, the signal core lines can be represented as:

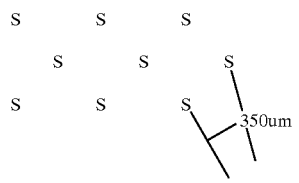

The separation between signal lines is now approximately 350 microns. Thus, assuming a limitation that the lines must be separated by 250 microns, the density of signal lines though the signal core can be increased relative to that of the signal lines on the chip. Since the signal lines pass through the power/ground layers, the lines are shorter than if they were required to pass around the power and ground lines. This reduces signal delays and propagation losses.

Another benefit of the present invention is that because the signal core and power/ground wrap are fabricated in parallel instead of as part of a sequential process flow, the two structures can be fabricated and tested separately. This reduces the cycle time and improves the yield for the overall process. It also permits different technologies and processes to be used for the two structures, permitting optimization of the process flow for each structure. In addition, since the majority of the power and ground vias typically used can be replaced by edge connectors, the number of vias formed is reduced, reducing the fabrication cost.

Although the present invention has been described with reference to exemplary materials and processes, it may also be practiced using other embodiments and variations of the inventive concept. For example, the signal core as well as the power/ground layers can be fabricated from flexible films or printed circuit boards (for low cost, low performance systems). If a printed circuit board is used for the signal core, then due to the low wiring density, more than one signal core can be laminated.

If a decoupling capacitor is required, then a thin film capacitor can be connected to the power/ground layers externally by connection to the edge connector in one (x) direction. If a termination resistor is required, then a thin film resistor can be connected to the edge of the signal layers externally in another (y) direction.

Although the described embodiment of the power/ground wrap has two layers, the total number of power/ground layers can be greater. Each of the layers can be connected through the edge connector(s). Note that a flexible edge insert can be built within the power/ground layers. The flexible edge insert can be inserted into the edge connector for the purpose of accommodating problems arising from the non-planarity of the edge connector.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. An interposer for connecting an integrated circuit chip to a mounting substrate, comprising:

a power and ground connection routing structure having a first substrate to which the integrated circuit chip is to be interconnected and a second substrate to which the mounting substrate is to be interconnected, the first and second substrates including a plurality of conductive vias formed therein for power and ground connection paths between the mounting substrate and a mounted integrated circuit chip; and a signal line routing structure disposed between the first and second substrates of the power and ground connection routing structure, and including a plurality of conductive vias formed therein for signal paths between the first and second substrates of the power and ground connection routing structure, wherein the power and ground connection paths are substantially isolated from the signal paths so that power is routed through the power and ground connection routing structure without passing through the signal line routing structure.

2. The interposer of claim 1, wherein the power and ground connection routing structure further comprises:

a patterned conductive layer arranged on a first and a second coplanar face of the first substrate, the conductive vias providing electrical connections between the conductive layers on the first and second faces of the first substrate; and a patterned conductive layer arranged on a first and a second coplanar face of the second substrate, the conductive vias providing electrical connections between the conductive layers on the first and second faces of the second substrate.

3. The interposer of claim 1, wherein the signal line routing structure further comprises:

a substrate having a first and a second coplanar face; and a patterned conductive layer arranged on the first coplanar face and the second coplanar face, the conductive vias for signal paths providing electrical connections between the conductive layers on the first and second faces.

4. The interposer of claim 1, further comprising:

a support member to maintain the first and second substrates of the power and ground connection routing structure at a desired separation.

5. The interposer of claim 2, wherein the power and ground connection routing structure further comprises:

a ground connection path between the first coplanar face of the first substrate and the second coplanar face of the second substrate.

6. The interposer of claim 2, wherein the power and ground connection routing structure further comprises:

a power connection path between the second coplanar face of the first substrate and the first coplanar face of the second substrate.

* * * * *